United States Patent [19]
Dennison et al.

[11] Patent Number: 6,004,854
[45] Date of Patent: Dec. 21, 1999

[54] METHOD OF FORMING CMOS INTEGRATED CIRCUITRY

[75] Inventors: Charles H. Dennison, Meridian; Mark Helm, Boise, both of Id.

[73] Assignee: Micron Technology, Inc., Boise, Id.

[21] Appl. No.: 09/097,880

[22] Filed: Jun. 15, 1998

Related U.S. Application Data

[63] Continuation of application No. 08/866,887, May 30, 1997, Pat. No. 5,776,806, which is a continuation of application No. 08/631,249, Apr. 12, 1996, Pat. No. 5,683,927, which is a continuation of application No. 08/503,419, Jul. 17, 1995, Pat. No. 5,534,449.

[51] Int. Cl.$^6$ .................................................. H01L 21/336
[52] U.S. Cl. .......................... 438/306; 438/199; 438/231; 438/275; 438/303; 438/305
[58] Field of Search ..................................... 438/199, 231, 438/275, 305, 307, 303, 306, FOR 168, FOR 204, FOR 205, FOR 208, FOR 216, FOR 217, FOR 218

[56] References Cited

U.S. PATENT DOCUMENTS

| | | | |
|---|---|---|---|
| 4,342,149 | 8/1982 | Jacobs et al. | 29/576 |
| 4,474,624 | 10/1984 | Matthews | 437/34 |
| 4,530,150 | 7/1985 | Shirato | 437/29 |
| 4,745,083 | 5/1988 | Huie | 437/57 |
| 4,753,898 | 6/1988 | Parrillo et al. | 437/57 |
| 4,764,477 | 8/1988 | Chang et al. | 437/57 |
| 4,771,014 | 9/1988 | Liou et al. | 437/57 |
| 4,876,213 | 10/1989 | Pfiester | 437/57 |
| 4,933,994 | 6/1990 | Orban | 437/57 |
| 4,950,617 | 8/1990 | Kumagai et al. | 437/44 |
| 4,968,639 | 11/1990 | Bergonzoni | 437/57 |
| 4,997,782 | 3/1991 | Bergonzoni | 437/57 |
| 5,015,595 | 5/1991 | Wollesen | 437/57 |
| 5,024,960 | 6/1991 | Haken | 437/57 |
| 5,036,019 | 7/1991 | Yamane et al. | 437/57 |
| 5,106,768 | 4/1992 | Kuo | 437/34 |

(List continued on next page.)

FOREIGN PATENT DOCUMENTS

| | | | |
|---|---|---|---|
| 0160754 | 7/1987 | Japan | 437/56 |
| 404023329 | 1/1992 | Japan | 437/44 |
| 406260496 | 9/1994 | Japan | 437/35 |

OTHER PUBLICATIONS

S. M. Sze, "Semiconductor Devices Physics and Technology," pp. 306–307 (1985).

*Primary Examiner*—Wael Fahmy
*Assistant Examiner*—Long Pham
*Attorney, Agent, or Firm*—Wells, St. John, Roberts, Gregory & Matkin P.S.

[57] ABSTRACT

A method of forming CMOS integrated circuitry includes, a) providing a series of gate lines over a semiconductor substrate, a first gate line being positioned relative to an area of the substrate for formation of an NMOS transistor, a second gate line being positioned relative to an area of the substrate for formation of a PMOS transistor; b) masking the second gate line and the PMOS substrate area while conducting a p-type halo ion implant into the NMOS substrate area adjacent the first gate line, the p-type halo ion implant being conducted at a first energy level to provide a p-type first impurity concentration at a first depth within the NMOS substrate area; and c) in a common step, blanket ion implanting phosphorus into both the NMOS substrate area and the PMOS substrate area adjacent the first and the second gate lines to form both NMOS LDD regions and PMOS n-type halo regions, respectively, the phosphorus implant being conducted at a second energy level to provide an n-type second impurity concentration at a second depth within both the PMOS substrate area and the NMOS substrate area, the first energy level and the first depth being greater than the second energy level and the second depth, respectively. Methods of forming memory and other CMOS integrated circuitry are also disclosed involving optimization of different NMOS transistors.

6 Claims, 3 Drawing Sheets

U.S. PATENT DOCUMENTS

| | | | |
|---|---|---|---|
| 5,141,890 | 8/1992 | Haken | 437/57 |
| 5,166,087 | 11/1992 | Kakimoto et al. | 437/44 |
| 5,170,232 | 12/1992 | Narita | 257/336 |
| 5,217,910 | 6/1993 | Shimizu et al. | 437/44 |
| 5,286,665 | 2/1994 | Muragishi et al. | 437/44 |
| 5,340,756 | 8/1994 | Nagayasu | 437/34 |
| 5,365,110 | 11/1994 | Matsuoka | 257/762 |
| 5,385,857 | 1/1995 | Solo De Zaldivar | 437/44 |
| 5,395,787 | 3/1995 | Lee et al. | 437/57 |
| 5,405,791 | 4/1995 | Ahmad et al. | |
| 5,413,945 | 5/1995 | Chien et al. | |
| 5,422,506 | 6/1995 | Zamapian | 257/344 |
| 5,424,571 | 6/1995 | Liou | 257/344 |
| 5,449,937 | 9/1995 | Arimura et al. | 257/344 |
| 5,500,379 | 3/1996 | Odake et al. | |
| 5,532,176 | 7/1996 | Katada et al. | |
| 5,534,449 | 7/1996 | Dennison et al. | |
| 5,554,869 | 9/1996 | Chang | 257/316 |
| 5,670,397 | 9/1997 | Chang et al. | 437/34 |
| 5,683,927 | 11/1997 | Dennison et al. | |
| 5,736,440 | 4/1998 | Manning | 438/232 |
| 5,747,855 | 5/1998 | Dennison et al. | 257/369 |
| 5,776,806 | 7/1998 | Dennison et al. | 438/199 |

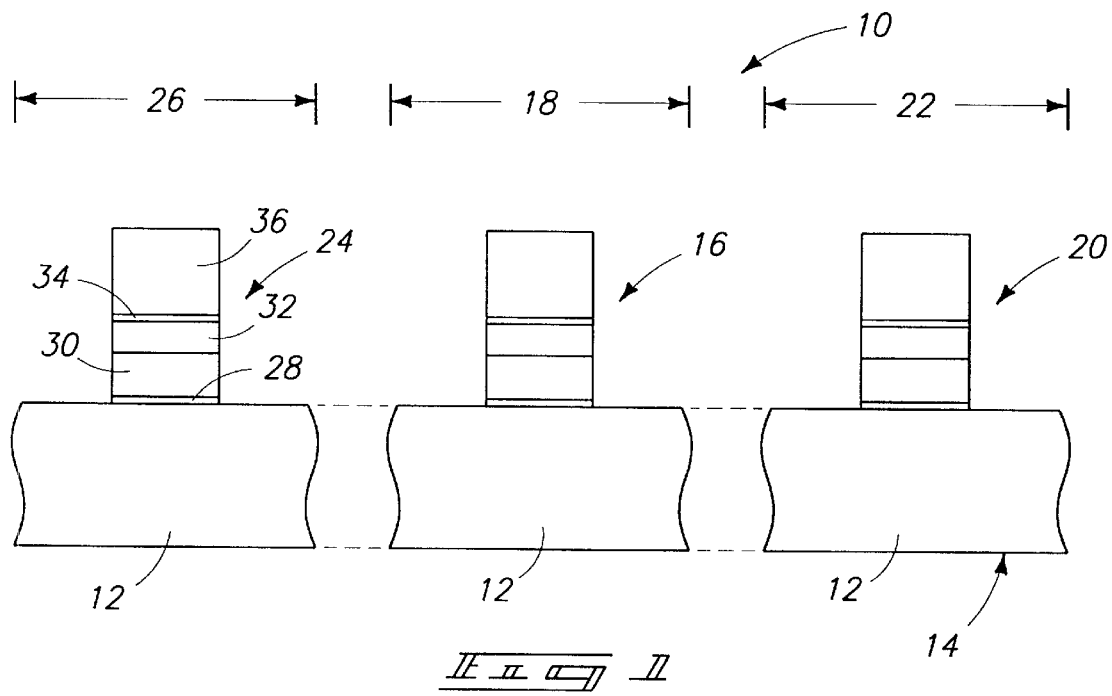
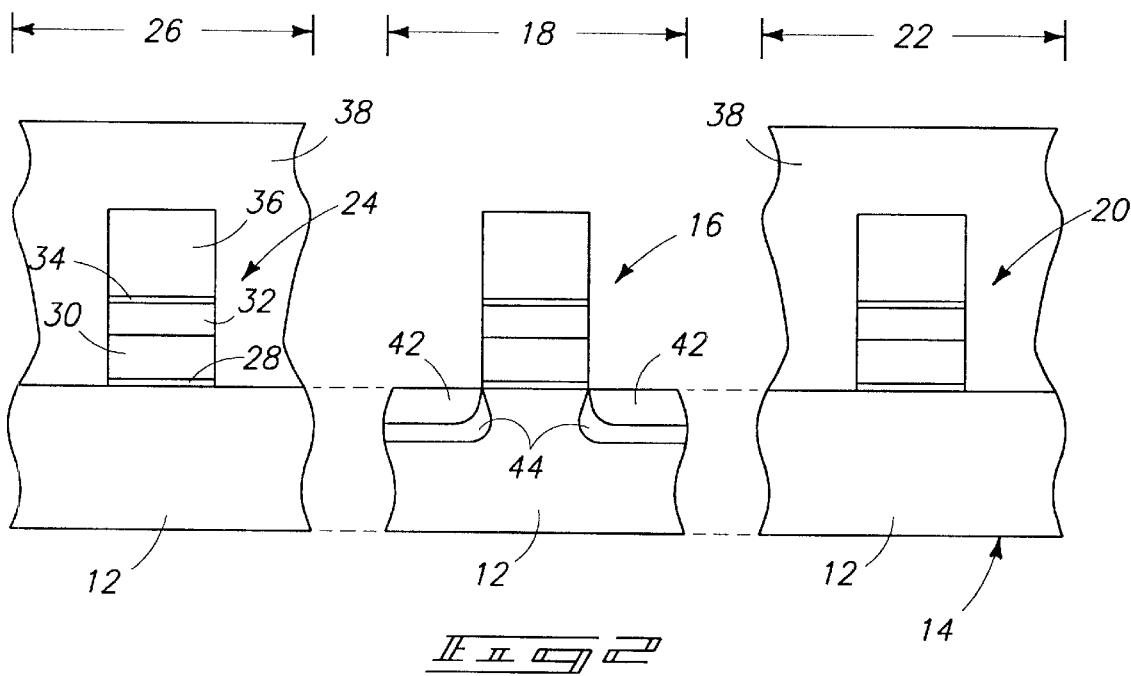

METHOD OF FORMING CMOS INTEGRATED CIRCUITRY

RELATED PATENT DATA

This patent resulted from a continuation application of U.S. application Ser. No. 08/866,887 filed on May 30, 1997 now U.S. Pat. No. 5,776,806, which is a continuation application of U.S. application Ser. No. 08/631,249, filed on Apr. 12, 1996, entitled "A Method Of Forming CMOS Integrated Circuitry" listing the inventors as Charles H. Dennison and Mark Helm now U.S. Pat. No. 5,683,927, which is a continuation application of U.S. application Ser. No. 08/503,419, filed on Jul. 17, 1995, entitled "A Method Of Forming CMOS Integrated Circuitry" listing the inventors as Charles H. Dennison and Mark Helm and which is now U.S. Pat. No. 5,534,449.

TECHNICAL FIELD

This invention relates to methods of forming complementary metal oxide semiconductor (CMOS) integrated circuitry, and to methods of forming field effect transistors.

BACKGROUND OF THE INVENTION

An MOS (metal-oxide-semiconductor) structure in semiconductor processing is created by superimposing several layers of conducting, insulating and transistor forming materials. After a series of processing steps, a typical structure might comprise levels of diffusion, polysilicon and metal that are separated by insulating layers.

CMOS is so-named because it uses two types of transistors, namely an n-type transistor (NMOS) and a p-type transistor (PMOS). These are fabricated in a semiconductor substrate, typically silicon, by using either negatively doped silicon that is rich in electrons or positively doped silicon that is rich in holes. Different dopant ions are utilized for doping the desired substrate regions with the desired concentration of produced holes or electrons.

MMOS remained the dominant MOS technology as long as the integration level devices on a chip was sufficiently low. It is comparatively inexpensive to fabricate, very functionally dense, and faster than PMOS. With the dawning of large scale integration, however, power consumption in NMOS circuits began to exceed tolerable limits. CMOS represented a lower-power technology capable of exploiting large scale integration fabrication techniques.

CMOS fabrication does however present a number of challenges to the fabricator as compared to using PMOS or NMOS alone. Specifically, typically independent or separate masking steps are utilized for masking one of the p-type regions while the n-type region is being doped. Also, the n-type regions are separately masked when the p-type regions are being doped. Accordingly, typical transistor flows use one mask each to form the n-channel and p-channel transistor source and drain regions. Higher levels of integration result in denser and denser circuits, leading CMOS fabrication to more difficulties.

It would be desirable to develop methods which further facilitate formation of complementary source and drain regions within a semiconductor substrate.

BRIEF DESCRIPTION OF THE DRAWINGS

Preferred embodiments of the invention are described below with reference to the following accompanying drawings.

FIG. 1 is a diagrammatic sectional view of a semiconductor wafer fragment at one processing step in accordance with the invention.

FIG. 2 is a view of the FIG. 1 wafer at a processing step subsequent to that shown by FIG. 1.

DETAILED DESCRIPTION OF THE PREFERRED EMBODIMENTS

Figure 3:
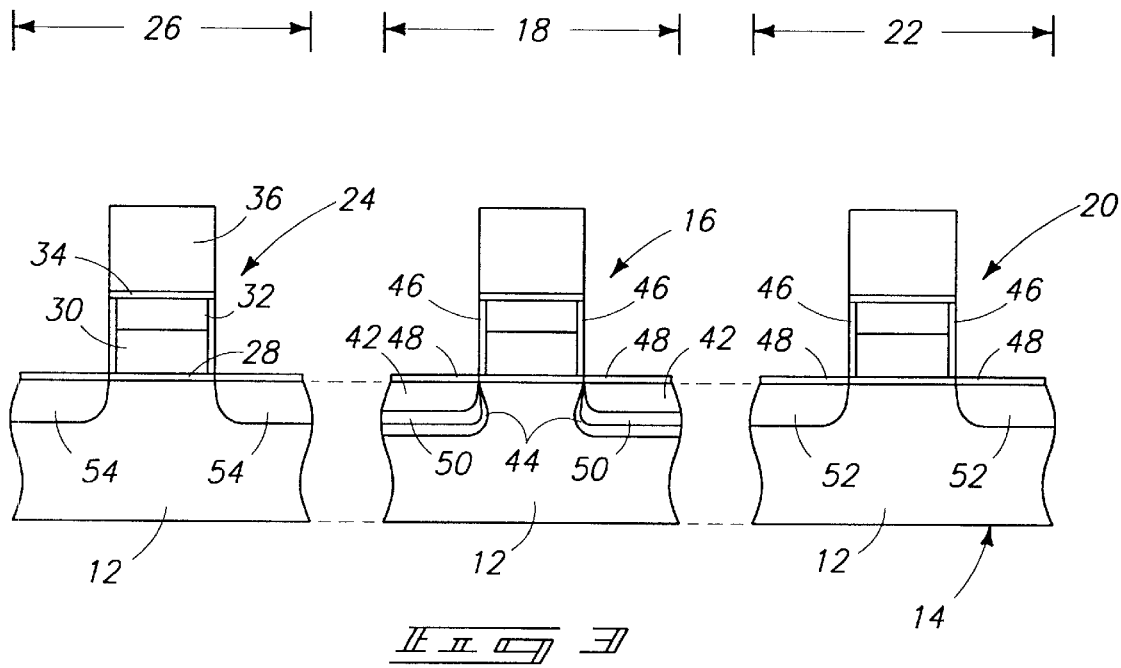
FIG. 3 is a view of the FIG. 1 wafer at a processing step subsequent to that shown by FIG. 2.

This disclosure of the invention is submitted in furtherance of the constitutional purposes of the U.S. Patent Laws "to promote the progress of science and useful arts" (Article 1, Section 8).

In accordance with one aspect of the invention, a method of forming CMOS memory integrated circuitry comprises the following steps:

providing a series of gate lines over a semiconductor substrate, the gate lines comprising memory array gate lines and peripheral circuitry gate lines, a first gate line being positioned relative to a first peripheral area of the substrate for formation of a peripheral NMOS transistor, a second gate line being positioned relative to a second peripheral area of the substrate for formation of a peripheral PMOS transistor, a third gate line being positioned relative to a memory array area of the substrate for formation of a memory array NMOS transistor;

masking the second gate line, the second peripheral PMOS substrate area, the third gate line and the memory array NMOS substrate area while conducting a p-type halo ion implant into the first peripheral NMOS substrate area adjacent the first gate line, the p-type halo ion implant being conducted at a first energy level to provide a p-type first impurity concentration at a first depth within the first peripheral NMOS substrate area; and in a common step, blanket ion implanting phosphorus into the first peripheral NMOS substrate area, the second peripheral PMOS substrate area and the memory array NMOS substrate area adjacent the first, the second and the third gate lines to form peripheral NMOS transistor LDD regions, peripheral PMOS transistor n-type halo regions and memory array NMOS transistor source/drain diffusion regions, respectively, the phosphorus implant being conducted at a second energy level to provide an n-type second impurity concentration at a second depth within the first, the second and the memory array substrate areas, the first energy level and the first depth being greater than the second energy level and the second depth, respectively.

In accordance with another aspect of the invention, a method of forming CMOS integrated circuitry comprises the following steps:

providing a series of gate lines over a semiconductor substrate, a first gate line being positioned relative to an area of the substrate for formation of an NMOS transistor, a second gate line being positioned relative to an area of the substrate for formation of a PMOS transistor;

masking the second gate line and the PMOS substrate area while conducting a p-type halo ion implant into the NMOS substrate area adjacent the first gate line, the p-type halo ion implant being conducted at a first energy level to provide a p-type first impurity concentration at a first depth within the NMOS substrate area; and in a common step, blanket ion implanting phosphorus into both the NMOS substrate area and the PMOS substrate area adjacent the first and the second gate lines to form both NMOS LDD regions and PMOS n-type halo regions, respectively, the phosphorus implant being conducted at a second energy level to provide an n-type second impurity concentration at a second depth within both the PMOS substrate area and the NMOS substrate area, the first energy level and the first depth being greater than the second energy level and the second depth, respectively.

More particularly, FIG. 1 illustrates portions of a semiconductor wafer fragment in process indicated generally with reference numeral 10. Such comprises a bulk silicon substrate 12 which is intrinsically p-doped, with a portion 14 thereof being subsequently n-doped to define an n-well. A series of gate lines are provided over semiconductor substrate 12. The discussion proceeds with reference to preferred formation of CMOS memory integrated circuitry with some of the gate lines comprising memory array gate lines and other of the gate lines constituting peripheral circuitry gate lines.

Specifically, a first gate line 16 is positioned relative to a first peripheral area 18 of substrate 12 for formation of a peripheral NMOS transistor. A second gate line 20 is positioned relative to a second peripheral area 22 of substrate 12 and n-well 14 for formation of a peripheral PMOS transistor. A third gate line 24 is positioned relative to a memory array area 26 for formation of a memory array NMOS transistor. Typical preferred present day cross sectional widths for gates 24, 16 and 20 are 0.40 micron, 0.42 micron, and 0.55 micron, respectively. In otherwords, the desired relationships are that the cross sectional widths of the n-channel periphery gates be greater than or equal to the memory array n-channel gates, with the p-channel peripheral gates being wider than both. The respective gate lines include a gate oxide layer 28, a conductive polysilicon layer 30, an overlying $WSi_x$ layer 32, an overlying novellus oxide layer 34, and a $Si_3N_4$ capping layer 36.

Referring to FIG. 2 a photoresist masking layer 38 is provided over second gate line 20, second peripheral PMOS substrate area 22, third gate line 24, and memory array NMOS substrate area 26. An n-type LDD implant 42, preferably As, is then provided into the exposed first peripheral NMOS substrate area 18 adjacent first gate line 16. An example and preferred average concentration of As for regions 42 is $8\times10^{18}$ ions/cm$^3$. An example depth for the peak concentration is 400 Angstroms.

A p-type halo ion implant is subsequently conducted into the exposed first peripheral NMOS substrate area 18 adjacent first gate line 16, thus producing p-type halo ion implant regions 44. The p-type halo ion implant is conducted at a first energy level to provide a p-type first impurity concentration at a first depth within first peripheral NMOS substrate area 18. The depth is preferably conducted to be deeper than the maximum concentration depth of As LDD regions 42. An example and preferred p-type implant material is boron. An example and preferred implant dose is $7\times10^{12}$ ions/cm$^2$–$1.5\times10^{13}$ ions/cm$^2$ to provide an example average dopant concentration of from $1\times10^{16}$ ions/cm$^3$ to $1\times10^{18}$ ions/cm$^3$, with about $1\times10^{17}$ ions/cm$^3$ being preferred. An example preferred implant energy is from 60 KeV to 100 KeV (70 KeV preferred) to provide a peak concentration implant depth of 2000 Angstroms. Most preferably, the p-type halo implant is conducted as a series of implants angled from 0°, with an angle of about 30° from vertical (i.e., from 0° being an example preferred angle. For example, a series of four 30° angled implants at 70 KeV at 90° wafer orientations using respective doses of $1.0\times10^{12}$ ions/cm$^2$ is a preferred implant sequence. Such provides an advantage of desirably driving a portion of the halo implant beneath the gate.

Referring to FIG. 3, masking layer 38 is removed and wafer fragment 10 is subjected to oxidizing conditions to form oxidized sidewalls 46 about the illustrated gate lines, and to form oxide 48 over exposed peripheral NMOS area 18, peripheral PMOS area 22, and memory array NMOS area 26.

Thereafter and in a common step, phosphorous is blanket ion implanted into exposed first peripheral NMOS substrate area 18, second peripheral PMOS substrate area 22, and memory array NMOS substrate area 26 adjacent the first, the second, and the third gate lines, respectively. This forms peripheral NMOS transistor LDD regions 50, peripheral PMOS transistor n-type halo regions 52, and memory array NMOS transistor source/drain diffusion regions 54. The phosphorous implant is conducted at a second energy level to provide respective n-type second impurity concentrations at a second depth within the first, the second and the memory array substrate areas. The first energy level and the first depth of implants 44 are chosen to be greater than the second energy level and the second depth, respectively, of the blanket phosphorus implant. Most preferably, the implant energy difference between the p-type halo implant and the n-type blanket implant is greater than or equal to 10 KeV to provide the peak concentration of regions 44 at 1000 Angstroms below that of regions 50. An example energy level for the phosphorous implant is from 30 Kev to 60 KeV, with 30 KeV being preferred An example and desired dose is from $7\times10^{12}$ ions/cm$^2$–$1.5\times10^{13}$ ions/cm$^2$ to provide an example average dopant concentration of diffusion regions 50, 52 and 54 of from $1\times10^{17}$ ions/cm$^3$ to $1\times10^{19}$ ions/cm$^3$, with about $8\times10^{17}$ ions/cm$^3$ being preferred.

The above described sequence is the preferred order by which the respective implants occur. The subject orders could be changed without departing from the principals and scope of the invention which is intended to be limited only by the accompanying claims appropriately interpreted in accordance the Doctrine of Equivalents. Most preferably, the As LDD implant is conducted before the sidewall and substrate oxidations. The p-type halo implant is preferably conducted either before or after such oxidations. And, the greatest success was achieved where the blanket phosphorous implant is conducted after the sidewall and substrate oxidations.

Figure 4:
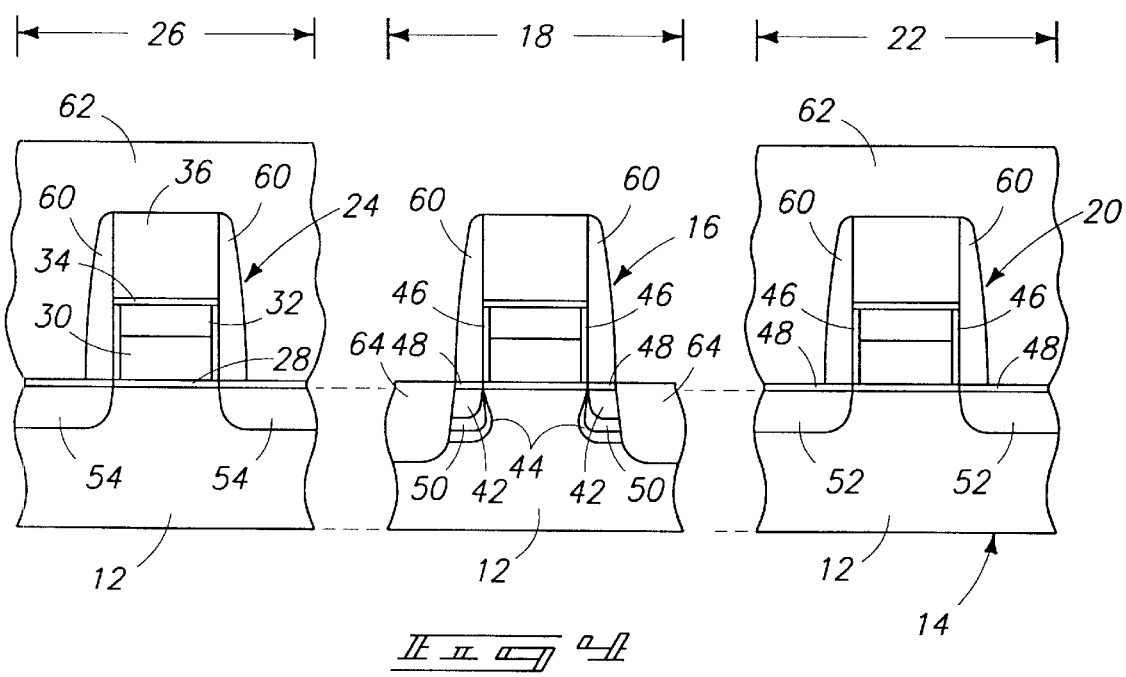
FIG. 4 is a view of the FIG. 1 wafer at a processing step subsequent to that shown by FIG. 3.

Referring to FIG. 4, oxide or nitride sidewall spacers 60 are provided about the illustrated respective gate lines. Thereafter, a photoresist masking layer 62 is provided and patterned to expose peripheral NMOS transistor area 18 and mask the illustrated array and p-channel periphery areas 22 and 26. An n-type implant is thereafter conducted to provide n-type diffusion regions 64 for the peripheral NMOS transistors to essentially complete formation thereof.

Figure 5:
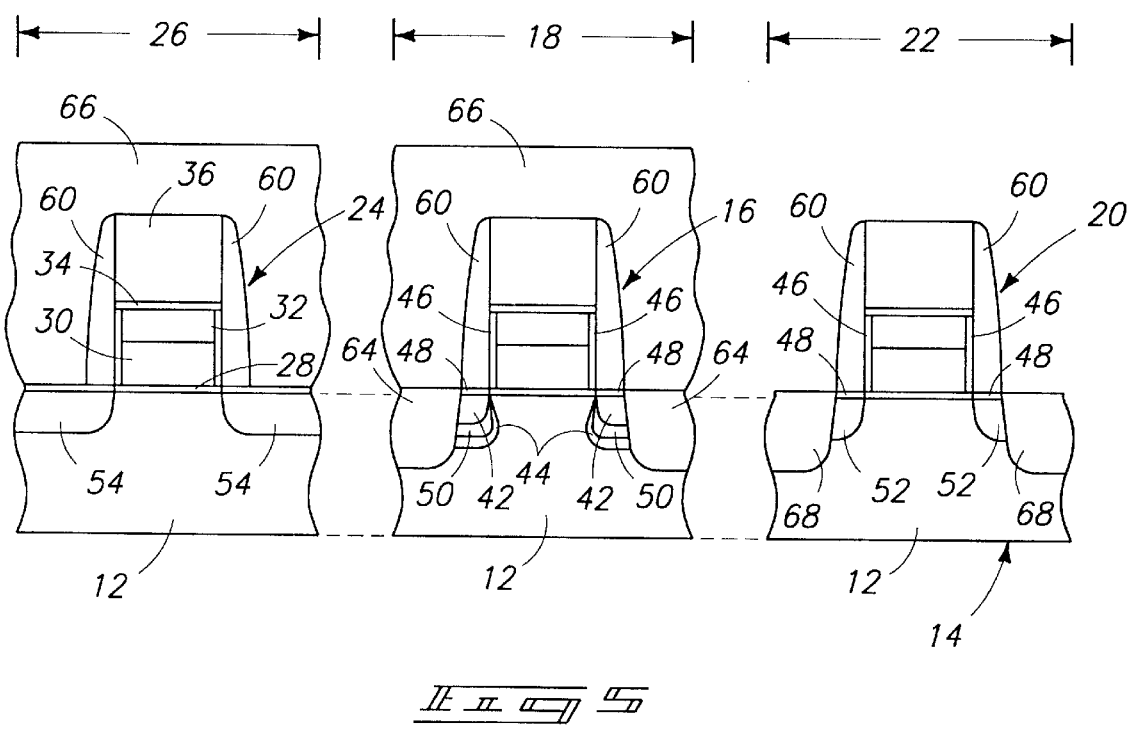
FIG. 5 is a view of the FIG. 1 wafer at a processing step subsequent to that shown by FIG. 4.

Referring to FIG. 5, the n-channel transistors are masked with a photoresist layer 66, and ion implantation is conducted with a p-type material (i.e., boron) into the peripheral PMOS transistor to form desired p-type source/drain diffusion regions 68.

Most preferably, additional doping in the memory array area relative to source/drain diffusion regions 54 is not required or conducted.

P-type halo implant 44 is provided principally for improving/eliminating short channel effects in the peripheral n-channel transistors. Accordingly with respect to the above described preferred embodiment, the single masking step of FIG. 2 provides several advantageous functions. The initial FIG. 2 doping enables provision of desired p-type n-channel halo implants 44. The subsequent blanket phosphorous implant provides the combination of a p-channel halo, a source/drain diffusion implant for the array, and reduction of n-channel periphery LDD resistance which is much more desirable for the NMOS peripheral transistors than for the NMOS array transistors. All FIG. 2 and 3 implants are preferably conducted with the single FIG. 2 masking, whereas prior art methods use multiple masks to achieve the same implants.

The above described embodiment was described principally with reference to formation of memory devices, such as DRAMs, that preferably utilized two different types of NMOS transistors and one type of PMOS transistors. The artisan will as well appreciate that the invention has application to non-memory devices including formation of three different transistor types. Further, the artisan will also appreciate applicability of the invention to formation of CMOS circuitry only incorporating one type of NMOS transistor and one type of PMOS transistor.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

We claim:

1. A method of forming a CMOS structure, comprising:
   forming NMOS halo regions, NMOS LDD regions and NMOS source/drain regions;
   forming PMOS halo regions and PMOS source/drain regions;
   forming memory array transistor source/drain regions;
   at least one blanket doping step to form at least one of the NMOS regions, at least one of the PMOS regions, and the memory array source/drain regions; wherein neither of the NMOS, PMOS or memory array source/drain regions is masked during said at least one blanket doping step; and
   no more than three masking layer provision steps to collectively form the NMOS halo regions, the NMOS LDD regions, the NMOS source/drain regions, the PMOS halo regions, the PMOS source/drain regions, and the memory array transistor source/drain regions.

2. The method of claim 1 comprising no more than two masking layer provision steps to collectively form the NMOS halo regions, the NMOS LDD regions, the NMOS source/drain regions, the PMOS halo regions, the PMOS source/drain regions, and the memory array transistor source/drain regions.

3. A method of forming a CMOS structure, comprising:
   forming NMOS halo regions, NMOS LDD regions and NMOS source/drain regions;
   forming PMOS halo regions and PMOS source/drain regions;
   forming memory array transistor source/drain regions;
   at least one blanket doping step to form at least one of the NMOS regions, at least one of the PMOS regions, and the memory array source/drain regions; wherein neither of the NMOS, PMOS or memory array source/drain regions is masked with photoresist during said at least one blanket doping step; and
   no more than three masking layer provision steps to collectively form the NMOS halo regions, the NMOS LDD regions, the NMOS source/drain regions, the PMOS halo regions, the PMOS source/drain regions, and the memory array transistor source/drain regions.

4. The method of claim 3 comprising no more than two masking layer provision steps to collectively form the NMOS halo regions, the NMOS LDD regions, the NMOS source/drain regions, the PMOS halo regions, the PMOS source/drain regions, and the memory array transistor source/drain regions.

5. The method of claim 1 where the masking layer provision steps comprise forming photoresist masking layers.

6. The method of claim 3 where the masking layer provision steps comprise forming photoresist masking layers.

* * * * *